US012796411B2

(12) United States Patent
Sherpa et al.

(10) Patent No.: US 12,796,411 B2
(45) Date of Patent: Nov. 10, 2026

(54) SELECTIVE HARDMASK ETCH FOR SEMICONDUCTOR PROCESSING

(71) Applicant: Applied Materials, Inc., Santa Clara, CA (US)

(72) Inventors: Sonam Dorje Sherpa, San Ramon, CA (US); Mir Abdulla Al Galib, Sunnyvale, CA (US); Alok Ranjan, San Ramon, CA (US); Kenji Takeshita, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 156 days.

(21) Appl. No.: 18/481,904

(22) Filed: Oct. 5, 2023

(65) Prior Publication Data

US 2025/0118557 A1 Apr. 10, 2025

(51) Int. Cl.

| | |
|---|---|
| ***H10P 76/40*** | (2026.01) |
| ***H10P 50/00*** | (2026.01) |
| ***H10P 50/24*** | (2026.01) |
| ***H10P 50/26*** | (2026.01) |

(Continued)

(52) U.S. Cl.

CPC ........ *H10P 76/4085* (2026.01); *H10P 50/242* (2026.01); *H10P 50/267* (2026.01); *H10P 50/283* (2026.01); *H10P 50/287* (2026.01); *H10P 50/692* (2026.01); *H10P 50/71* (2026.01); *H10P 76/204* (2026.01); *H10P 76/405* (2026.01)

(58) Field of Classification Search

None

See application file for complete search history.

(56) References Cited

U.S. PATENT DOCUMENTS

| | | | |
|---|---|---|---|
| 11,079,682 | B1 | 8/2021 | Han et al. |
| 2018/0082849 | A1 | 3/2018 | Ingle et al. |
| 2019/0221441 | A1 | 7/2019 | Jiang et al. |

(Continued)

FOREIGN PATENT DOCUMENTS

| | | | |
|---|---|---|---|
| TW | 202309328 | A | 3/2023 |
| WO | 2022164820 | A1 | 8/2022 |

OTHER PUBLICATIONS

G.S. Oehrlein et al., "Polymer-plasma interactions: A review of progress in understanding polymer resist mask durability during plasma etching for nanoscale fabrication", J. Vac. Sci. Technol. B29, paper# 010801. (Year: 2011).*

(Continued)

*Primary Examiner* — Jiong-Ping Lu

(74) *Attorney, Agent, or Firm* — Kilpatrick Townsend & Stockton LLP

(57) ABSTRACT

Methods of semiconductor processing may include forming plasma effluents of a hydrogen-and-fluorine-containing precursor. The plasma effluents may then contact a silicon-containing hardmask material and a photoresist material. The silicon-containing hardmask material can overlay an organic material overlaying a substrate in a processing region of a semiconductor processing chamber. Etching the silicon-containing hardmask material with the plasma effluents while the photoresist material with the plasma effluents. The silicon-containing hardmask material can be etched at a selectivity greater than or about 10 relative to the photoresist material. A temperature in the processing region can be maintained at about −20° C. or less.

19 Claims, 3 Drawing Sheets

(51) Int. Cl.
*H10P 50/28* (2026.01)
*H10P 76/20* (2026.01)

(56) References Cited

U.S. PATENT DOCUMENTS

| | | | | |
|---|---|---|---|---|
| 2020/0105911 | A1 | 4/2020 | Chang | |
| 2020/0328089 | A1* | 10/2020 | Hama | H01L 21/31138 |
| 2022/0020599 | A1* | 1/2022 | Koshizawa | H01L 21/02274 |
| 2022/0356584 | A1* | 11/2022 | Tomura | H01J 37/3244 |
| 2022/0367202 | A1* | 11/2022 | Suda | H01J 37/32972 |
| 2023/0197465 | A1 | 6/2023 | Marchegiani | |

OTHER PUBLICATIONS

PCT/US2024/049830, “International Search Report and Written Opinion”, Jan. 8, 2025, 8 pages.

* cited by examiner

SELECTIVE HARDMASK ETCH FOR SEMICONDUCTOR PROCESSING

TECHNICAL FIELD

The present technology relates to semiconductor systems, processes, and equipment. More specifically, the present technology relates to etching and patterning processes in semiconductor fabrication.

BACKGROUND

Integrated circuits are made possible by processes that produce intricately patterned material layers on substrate surfaces. Producing patterned material on a substrate requires controlled methods for the removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. As a result of the diversity of materials, circuits, and processes, etch processes have been developed with a selectivity towards a variety of materials.

As features and their corresponding critical dimensions get smaller, aspect ratios for the combined thickness of photoresist and masks compared to the critical dimensions can become larger. Larger aspect ratios of the combined thickness to critical dimensions can lead to structural instabilities during the patterning process. These structural instabilities can lead to lower effective yields when fabricating semiconductor devices. Therefore, the combined thickness of photoresist and masks may have to decrease to lower the aspect ratios to critical dimensions. In some cases, an etchant for the mask may also significantly etch the photoresist, thus requiring a larger thickness of photoresist. Having a high selectivity etch for the mask compared to the photoresist can enable lower combined thicknesses of photoresist and masks.

Thus, there is a need for improved systems and methods that can be used to produce high quality devices and structures. These and other needs are addressed by the present technology.

SUMMARY

Exemplary methods of semiconductor processing may include forming plasma effluents of a hydrogen-and-fluorine-containing precursor; contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents access to the silicon-containing hardmask material, wherein the photoresist material comprises a dielectric material; etching the photoresist material with the plasma effluents; and while etching the photoresist material, etching the silicon-containing hardmask material with the plasma effluents, wherein the silicon-containing hardmask material is etched at a selectivity greater than or about 10 relative to the photoresist material.

Exemplary methods of semiconductor processing may include forming plasma effluents of a hydrogen-and-fluorine-containing precursor, wherein a volumetric ratio of the hydrogen-and-fluorine-containing precursor relative to other gases is greater than or about 50:1 when forming the plasma effluents; contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents to access the silicon-containing hardmask material, wherein the photoresist material comprises a dielectric material; etching the photoresist material with the plasma effluents; and while etching the photoresist material, etching the silicon-containing hardmask material with the plasma effluents, wherein the silicon-containing hardmask material is etched at a selectivity greater than or about 10 relative to the photoresist material.

Exemplary methods of semiconductor processing may include forming plasma effluents of HF gas, wherein a carrier gas is present; contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents to access the silicon-containing hardmask material, wherein one or more apertures are characterized by a critical dimension of less than or about 50 nm, wherein the photoresist material is configured for EUV patterning; etching the photoresist material with the plasma effluents; and while etching the photoresist material, etching the silicon-containing hardmask material with the plasma effluents, wherein the silicon-containing hardmask material is etched at a selectivity greater than or about 10 relative to the photoresist material.

In any embodiments, any and all of the following features may be implemented in any combination and without limitation. A volumetric ratio of the hydrogen-and-fluorine-containing precursor relative to other gases can be greater than or about 50:1 when forming the plasma effluents. a carrier gas can be present when forming plasma effluents. A temperature in the processing region can be maintained at about −20° C. or less. The silicon-containing hardmask material can include one or more of: a silicon-containing anti-reflective coating and SiON. One or more apertures can be characterized by a critical dimension of less than or about 50 nm. Prior to etching the silicon-containing hardmask material, an aspect ratio of a thickness of the photoresist material to a thickness of the silicon-containing hardmask material can be less than or about 5:1. After etching the silicon-containing hardmask material, an aspect ratio of a thickness of the photoresist material to a thickness of the silicon-containing hardmask material can be greater than or about 4:1. A thickness of the photoresist material can be about or less than 50 nm. A pressure in the processing region can be maintained at about 50 milliTorr or less. The plasma effluents can be generated at a plasma power of about 1000

W or less. A chucking voltage of a power source of the semiconductor processing chamber can be about 2000 volts or less. The photoresist material can be configured for EUV patterning. After the etching of the silicon-containing hardmask material, the organic material can be exposed. The hydrogen-and-fluorine-containing precursor can be HF.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

Figure 1:
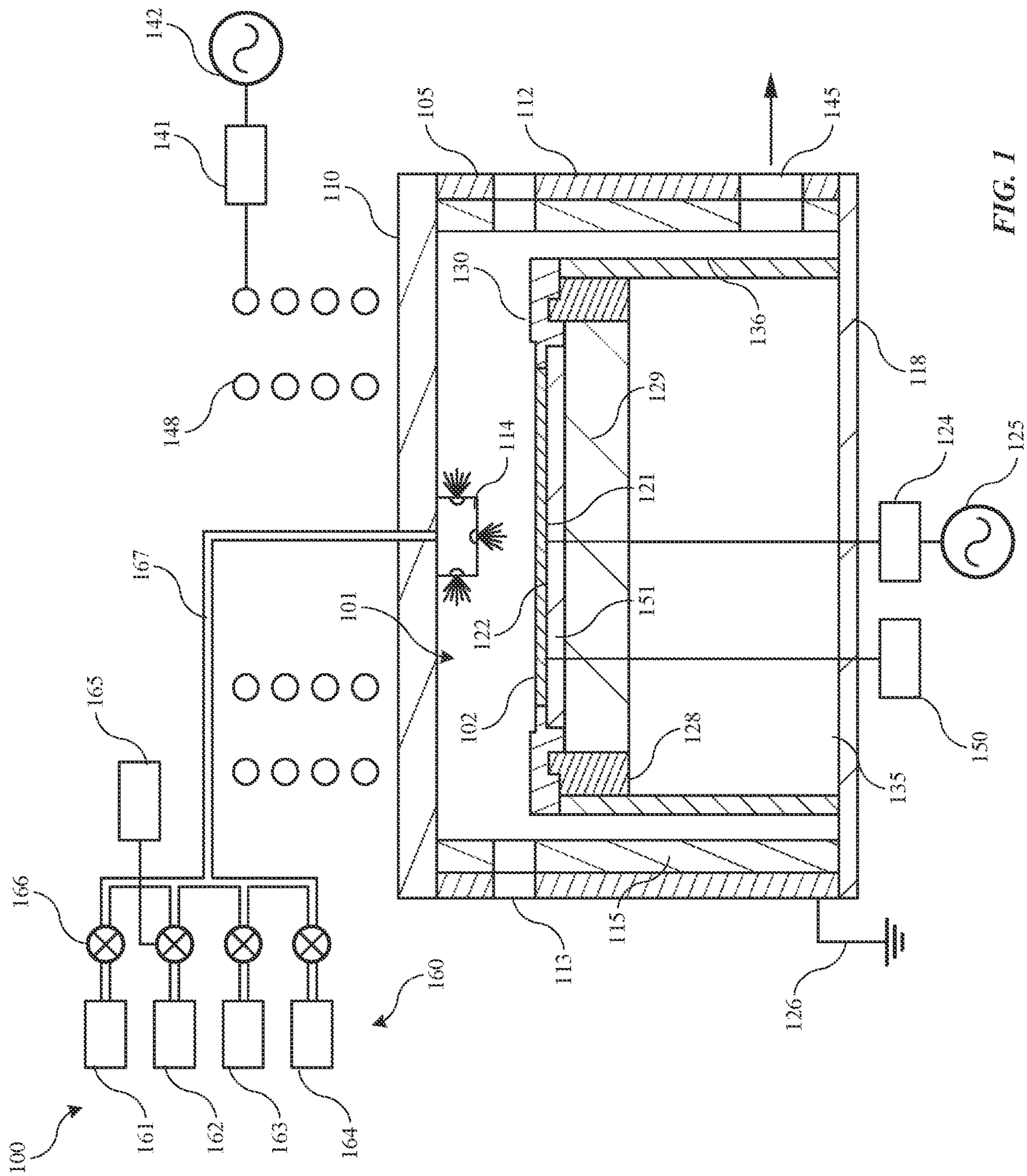
FIG. 1 shows a schematic cross-sectional view of an exemplary processing chamber according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label with a letter that distinguishes among the similar components. If only the first reference label is used in the specification, the description applies to any one of the similar components having the same first reference label irrespective of the letter.

DETAILED DESCRIPTION

Using a hydrogen-and-fluorine-containing precursor to form plasma effluents for etching a silicon-containing hardmask material can enable thinner layers of photoresist material overlaying the silicon-containing hardmask material. Plasma effluents formed from a hydrogen-and-fluorine-containing precursor can etch the silicon-containing hardmask material at a selectivity greater than or about 10 relative to the photoresist material. In one example, the temperature of a processing region of the semiconductor processing chamber can be maintained at about −20° C. or less. In one example, the silicon-containing hardmask material can be silicon oxynitride (SiON). In one example, the aspect ratio of a thickness of the photoresist material to a thickness of the silicon-containing hardmask material is less than or about 5:1.

As semiconductor structures decrease in size, the dimension of the features on said structures also decrease and often become more densely packed. For example, the critical dimensions of features and the pitch decrease. Forming features on semiconducting structures can be achieved using a variety of methods including patterning and etching an organic material using a photoresist material and a hardmask material. Apertures in the photoresist material and the mask material can allow for etching the underlying organic material in desired locations. Conventional technologies use plasma etching to etch the hardmask material prior to etching the underlying organic material. However, the etchants can etch through the photoresist material exposing the hardmask material. This can lead to a defective and/or deficient hardmask material while etching the underlying organic material. Defects in the hardmask material can lead to features in the organic material with irregular dimensions. Conventional technologies use a thicker layer of photoresist material to prevent the etchant from etching through the photoresist material to the hardmask material. However, having a greater combined thickness for the photoresist material and the hardmask material can lead to structural and/or mechanical instability as the critical dimension (or width) at the opening of the features decrease. Increased structural and/or mechanical instability can cause structural collapse (such as line collapse) and a nonfunctional feature and/or semiconductor device.

The present technology overcomes these issues with a hydrogen-and-fluorine-containing precursor (e.g., HF gas). Via a plasma etching method, the hydrogen-and-fluorine-containing precursor can produce hydrogen-and-fluorine-containing plasma effluents. The hydrogen-and-fluorine-containing plasma effluents have a high selectivity for a silicon-containing hardmask material as compared to a photoresist material. The hydrogen-and-flouring-containing plasma effluents can etch the silicon-containing hardmask material at a low temperature, referred to as a cryo etch. This etching method can enable extreme ultraviolet (EUV) patterning for extremely small dimension features. Further, the hydrogen-and-fluorine-containing plasma effluents are a non-polymerizing chemistry preventing unwanted reactions.

Although the remaining disclosure will routinely identify specific semiconductor processing methods utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 illustrates a schematic cross-sectional view of an exemplary processing chamber 100 suitable for patterning a material layer disposed on a substrate 102 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 102 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 102 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. An example process gas is HF gas. Other examples of process gases that may be provided by the gas panel 160 include, but are not limited to, hydrocarbon containing gas including methane, silicon tetrafluoride, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gases may include nitrogen, chlorine, fluorine, oxygen, and hydrogen containing gases such as $H_2$, $NH_3$, $H_2O$, $H_2O_2$, $NF_3$, $F_2$, $CF_4$, $CHF_3$, $C_2F_6$, $C_2F_4$, $C_3F_6$, $C_4F_6$, $C_4F_8$, $BrF_3$, $ClF_3$, $SF_6$, $CH_3F$, $CH_2F_2$, $BC_{13}$, $PF_3$, $PH_3$, $SO_2$, and COS, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 102 and/or above the substrate 102 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 102 during processing. The substrate support pedestal 135 may include an electrostatic chuck 122 for holding the substrate 102 during processing. The electrostatic chuck ("ESC") 122 may use the electrostatic attraction to hold the substrate 102 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 102 seated on the pedestal. The RF power supply 125 may cycle on and off, or pulse, during processing of the substrate 102. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 5000 volts to about −5,000 volts to the electrode 121. The power source 150 may also include a system controller for controlling the operation of the electrode 121 by directing a DC current to the electrode 121 for chucking and de-chucking the substrate 102. For example, similar to the RF power supply 125, power supply 150 may provide a bias which attracts plasma ions, formed by the process gases in the chamber volume 101, to the ESC 122 and substrate 102 seated on the pedestal. The power supply 150 may cycle on and off, or pulse, during processing of the substrate 102. In embodiments, the power supply 150 may supply RF power, DC current or voltage for chucking and/or bias, or a combination thereof. In additional embodiments, multiple power supplies may be configured to supply RF power and DC current or voltage for chucking and/or bias. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 102 disposed thereon. The ESC 122 may be configured to perform in the temperature range required by the thermal budget of the device being fabricated on the substrate 102. For example, the ESC 122 may be configured to maintain the substrate 102 at a temperature of about −150° C. or lower to about 500° C. or higher depending on the process being performed.

The cooling base 129 may be provided to assist in controlling the temperature of the substrate 102. To mitigate process drift and time, the temperature of the substrate 102 may be maintained substantially constant by the cooling base 129 throughout the time the substrate 102 is in the cleaning chamber. In some embodiments, the temperature of the substrate 102 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 102, while shielding the top surface of the substrate support pedestal 135 from the plasma environment inside the plasma processing chamber 100. Lift pins may be selectively translated through the substrate support pedestal 135 to lift the substrate 102 above the substrate support pedestal 135 to facilitate access to the substrate 102 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 2:
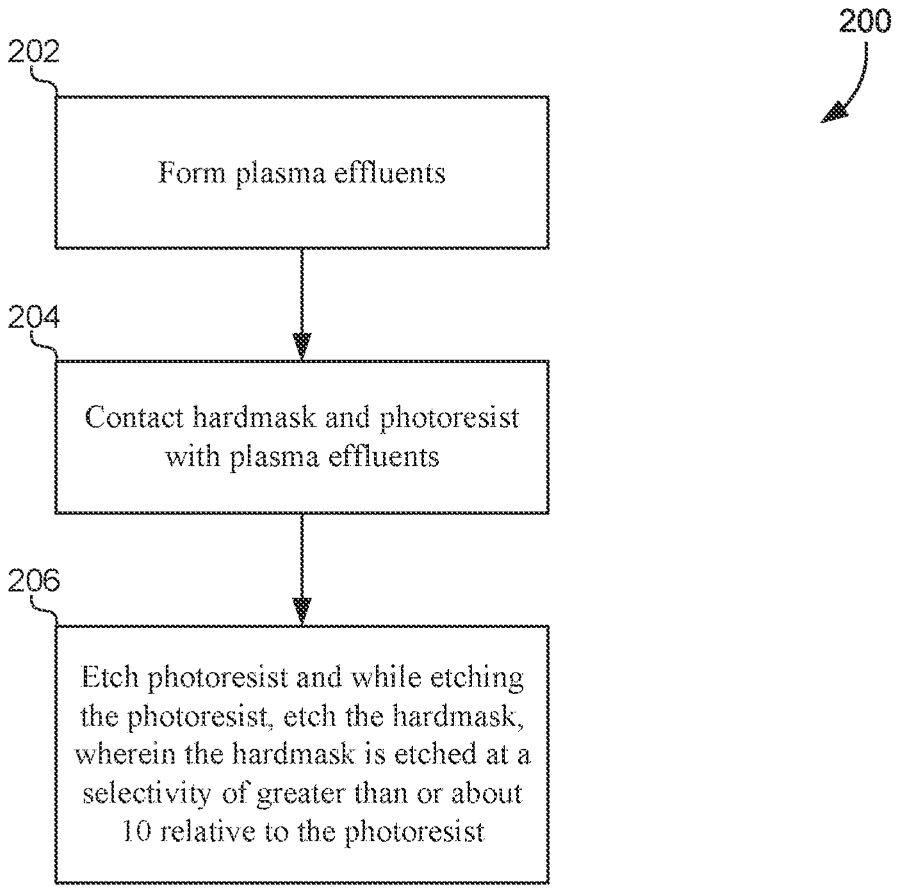
FIG. 2 shows operations in a semiconductor processing method according to some embodiments of the present technology.

The chambers discussed previously may be used in performing exemplary methods including etching methods and treatment methods. Turning to FIG. 2 is shown exemplary operations in method 200 according to embodiments of the present technology. Before the first operation of the method, a substrate may be processed in one or more ways (e.g., front-end processing, deposition, etching, polishing, cleaning, or any other operation) before being placed within a processing region of a chamber in which method 200 may be performed. Some or all of these operations may be performed in chambers or system tools as previously described or may be performed in different chambers on the same system tool, which may include the chamber in which the operations of method 200 are performed.

Figure 3A:
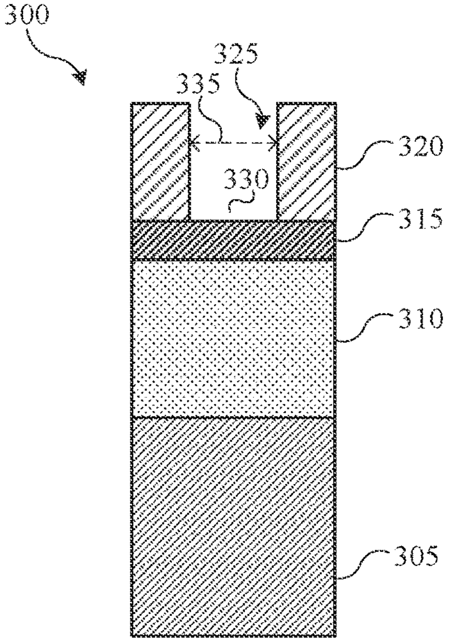
FIGS. 3A-3C show exemplary schematic cross-sectional structures produced according to some embodiments of the present technology.
Figure 3B:
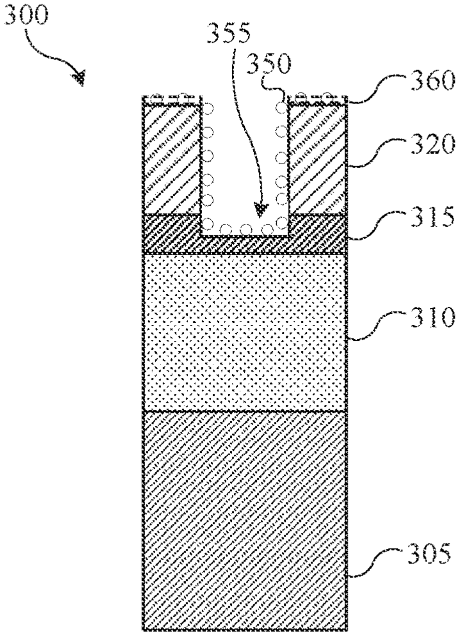
Figure 3C:
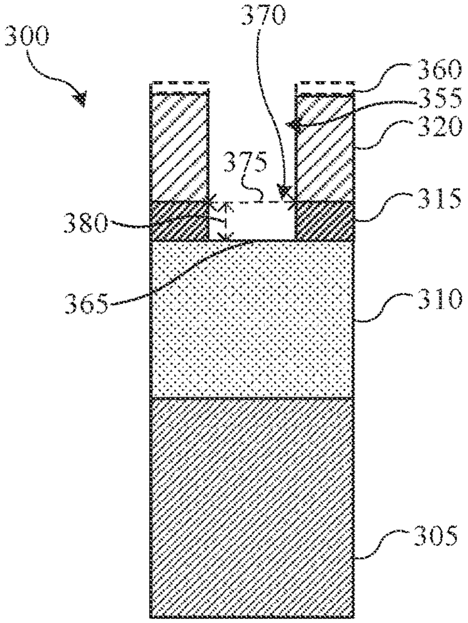

Method 200 may include several optional operations, which may or may not be specifically associated with some embodiments of methods according to the present technology. For example, many of the operations are described to provide a broader scope of the structural formation but are not critical to the technology or may be performed by alternative methodology as will be discussed further below. Method 200 describes operations shown schematically in FIGS. 3A-3C, the illustrations of which will be described in conjunction with the operations of method 200. It is to be understood that FIGS. 3A-3C illustrates only partial schematic views, and a substrate may contain any number of structural sections having aspects as illustrated in the figures, as well as alternative structural aspects that may still benefit from operations of the present technology.

Method 200 may or may not involve optional operations to develop the semiconductor structure 300 to a particular fabrication operation. It is to be understood that method 200 may be performed on any number of semiconductor structures 300, and FIG. 3A illustrates one exemplary structure within which a contact cleaning or etching process may be performed. As illustrated in FIG. 3A, a processed semiconductor structure 300 may include an organic material 310 (for example, a carbon-containing material) overlaying a substrate 305. The processed semiconductor structure 300 may also include a hardmask 315 overlaying the organic material 310. The processed semiconductor structure 300 may also include a photoresist 320 (also referred to as a photoresist material) overlaying the hardmask 315 (also referred to as a hardmask material). Substrate 305 may be or may include a dielectric material, such as an oxide or nitride of any number of materials. For example, the organic material 310 may be or may include carbon-containing material, a polymer material, a monomer material, or a carbon-and-hydrogen-containing material which may include heteroatoms such as nitrogen, sulfur, and oxygen, or any combination of materials thereof.

Although the hardmask 315 is illustrated as a single layer of material, the hardmask 315 may include one or more layers of material. The hardmask 315 may be composed of one or more layers (e.g., up to 10 layers) of material. Individual layers of the hardmask 315 may include materials like silicon, silicon oxide, silicon nitride, silicon oxynitride, or any combination thereof. In some examples, the layers of the hardmask 315 are predominantly a silicon-containing material. In some examples, the layers of the hardmask 315 are predominantly silicon oxynitride. In some examples, the layers of the hardmask 315 are predominantly a silicon anti-reflective coating. In some examples, the silicon anti-reflective coating can be spin-coated onto the organic material 310. The hardmask 315 may be characterized by a thickness of less than or about 100 nm, less than or about 95 nm, less than or about 90 nm, less than or about 85 nm, less than or about 80 nm, less than or about 75 nm, less than or about 70 nm, less than or about 65 nm, less than or about 60 nm, less than or about 55 nm, less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, less than or about 5 nm. The thickness of the hardmask 315 may range from between 5 nm and 100 nm, or any subrange combination therein, such as 10 nm to 100 nm, 10 nm to 50 nm, 5 nm to 20 nm, 5 nm to 10 nm, or 5 nm to 50 nm. Similarly, the thickness of the hardmask 315 can be any value between 5 nm and 100 nm (for example, 26 nm and 71 nm).

Although photoresist 320 is illustrated as a single layer of material, the photoresist 320 may include one or more layers of material. The photoresist 320 may be composed of one or more layers (e.g., up to 10 layers) of material. The photoresist 315 may be or include a patterned photoresist layer, such as a lithographically patterned mask or fabricated by other materials. The photoresist layer may be a positive tone photoresist, a negative tone photoresist, a UV lithography photoresist, an i-line photoresist, an e-beam resist (for example, a chemically amplified resist (CAR)), or another suitable photoresist. The photoresist 320 can be configured for EUV patterning. The photoresist 320 can be any material suitable for EUV patterning. For example, photoresist material for EUV patterning tend to be thinner than conventional photoresist. The photoresist material 320 may be characterized by a thickness of less than or about 200 nm, less than or about 195 nm, less than or about 190 nm, less than or about 185 nm, less than or about 180 nm, less than or about 175 nm, less than or about 170 nm, less than or about 165 nm, less than or about 160 nm, less than or about 155 nm, less than or about 150 nm, less than or about 145 nm, less than or about 140 nm, less than or about 135 nm, less than or about 130 nm, less than or about 125 nm, less than or about 120 nm, less than or about 115 nm, less than or about 110 nm, less than or about 105 nm, less than or about 100 nm, less than or about 95 nm, less than or about 90 nm, less than or about 85 nm, less than or about 80 nm, less than or about 75 nm, less than or about 70 nm, less than or about 65 nm, less than or about 60 nm, less than or about 55 nm, less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, less than or about 5 nm. The thickness of the hardmask 315 may range from between 5 nm and 200 nm, or any subrange combination therein, such as 10 nm to 200 nm, 10 nm to 100 nm, 10 nm to 50 nm, 50 nm to 100 nm, or 20 nm to 60 nm. Similarly, the thickness of the photoresist material 320 can be any value between 5 nm and 100 nm (for example, 34 nm and 162 nm).

The photoresist 320 may be patterned to form apertures 325 through the photoresist 320 that exposes portions 330 of underlying hardmask 315. The aperture 320 may be characterized by a critical dimension 335 (or width of the aperture 325) of less than or about 100 nm, less than or about 95 nm, less than or about 90 nm, less than or about 85 nm, less than or about 80 nm, less than or about 75 nm, less than or about 70 nm, less than or about 65 nm, less than or about 60 nm, less than or about 55 nm, less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, less than or about 5 nm. The critical dimension 335 may range from 5 nm to 100 nm, or any subrange combination therein, such as 5 nm to 100 nm, 5 nm to 40 nm, 5 nm to 30 nm, 5 nm to 20 nm, 10 nm to 50 nm, 10 nm to 20 nm, or 5 nm to 10 nm. Similarly, the critical dimension can be any value between 5 nm and 100 nm (for example, 14 nm and 68 nm). It is to be understood that the noted structure is not intended to be limiting, and any of a variety of other semiconductor structures are similarly encompassed. While the methods 200 of the present disclosure may be applicable to small and large apertures, advantageously, the methods of the present disclosure are relevant to apertures with a small critical dimension 330 of less than or about 50 nm, such as 5 nm to 50 nm, 5 nm to 25 nm, 10 nm to 20 nm, or 25 nm to 50 nm. Other exemplary structures may include two-dimensional and three-dimensional structures common in semiconductor manufacturing, and within which a hardmask and/or an organic material is to be removed.

At operation 202, method 200 may include forming plasma effluents 350 of a hydrogen-and-fluorine-containing precursor. For example, the hydrogen-and-fluorine-containing precursor may include hydrogen fluoride gas (HF). A hydrogen-and-fluorine-containing precursor can be beneficial because it can be a non-polymerizing chemistry. In this way, the hydrogen-and-fluorine-containing precursor can react with fewer other materials, including the organic material 310, than other precursors. This can simplify the etching and patterning process. The precursors for the method 200 may also include any number of carrier gases, which may include nitrogen, helium, argon, or other noble, inert, or useful precursors.

The plasma effluents 350 formed from the hydrogen-and-fluorine-containing precursor may be formed locally in the processing region or in a remote plasma system. That is, the plasma effluents 350 may be produced in the processing region of the semiconductor processing chamber housing the semiconductor structure 300. Alternatively, the plasma effluents 350 may be produced remotely and provided to the processing region of the semiconductor processing chamber housing the semiconductor structure 300. For example, the plasma treatment may be generated by a remote plasma source (RPS), a capacitively coupled plasma (CCP), or an inductively coupled plasma (ICP) with or without one or more carrier gases such as argon (Ar), helium (He), $NH_3$, nitrogen ($N_2$), $H_2$, or mixtures thereof. The plasma effluents 350 may be a low-level plasma to limit the amount of bombardment, sputtering, and surface modification. In embodiments, the plasma power may be less than or about 1,500 W, less than or about 1,250 W, less than or about 1,000 W, less than or about 900 W, less than or about 800 W, less than or about 750 W, less than or about 700 W, less than or about 600 W, less than or about 500 W, less than or about 400 W, less than or about 300 W, less than or about 250 W, less than or about 200 W, less than or about 100 W, or less, although the plasma power may also be included in ranges between any two of these stated numbers or within any smaller range encompassed by any of the stated ranges. By utilizing a low-level plasma power, the plasma effluents 350 may be better controlled for delivery through the apertures 325 of the photoresist 320, while limiting sputtering of the photoresist 320 as well as other exposed surfaces.

At operation 204, method 200 may include contacting the hardmask 315 and the photoresist 320 with the plasma effluents 350 in the processing region of the semiconductor processing chamber. At operation 206, the contacting of the photoresist 320 with the plasma effluents 350 may cause etching of the photoresist 320, as illustrated by etched photoresist 360 in FIG. 3B. The etched photoresist 360 indicates photoresist that was etched away by the plasma effluents 350. Further, the contacting of the hardmask 315 with the plasma effluents 350 may cause etching of the hardmask 315, which may form and/or deepen a feature 355 in the hardmask 315 and the photoresist 320. The plasma effluents 350 can etch the hardmask 315 at a selectivity of greater than or about 10 relative to the photoresist 320. The hardmask 315 can be etched to expose the organic material 310.

The hardmask 315 may define a bottom 365 of the feature 355 and each of the apertures 320 defines an opening 370 at the top of the hardmask 315. After completion of method 200 illustrated in FIG. 3C, the feature 355 may be characterized by a critical dimension 375 at the opening 370 at the top of the hardmask 315, a depth 380 from the opening 370 to the bottom 365 of the feature 355 (approximately equivalent to the thickness of the hardmask 315), an aspect ratio (depth 380 relative to critical dimension 375), or any combination thereof. After completion of method 200, the feature 355 may be characterized by a critical dimension 375 of less than or about 100 nm, such as 5 nm to 100 nm, 10 nm to 50 nm, 10 nm to 25 nm, 5 nm to 10 nm, 50 nm to 500 nm, 250 nm to 750 nm, or 500 nm to 1000 nm, and preferably less than or about 50 nm, such as 5 nm to 50 nm, 5 nm to 25 nm, 10 nm to 20 nm, or 25 nm to 50 nm. After completion of method 200, a depth from the top of the photoresist 320 to the bottom 365 of the feature 355 of less than or about 300 nm, such as 100 nm to 300 nm, 10 nm to 100 nm, 50 nm to 100 nm, 10 nm to 50 nm, or 10 nm to 200 nm. After completion of method 200, an aspect ratio of a depth from the top of the photoresist 320 to the bottom 365 of the feature 355 relative to the critical dimension 375 can be characterized with an aspect ratio of less than or about 100:1, such as less than or about 95:1, less than or about 90:1, less than or about 85:1, less than or about 80:1, less than or about 75:1, less than or about 70:1, less than or about 65:1, less than or about 60:1, less than or about 65:1, less than or about 60:1, less than or about 55:1, less than or about 50:1, less than or about 45:1, less than or about 40:1, less than or about 35:1, less than or about 30:1, less than or about 25:1, less than or about 20:1, less than or about 15:1, less than or about 10:1, less than or about 5:1, or less, or 5:1 to 100:1, 5:1 to 50:1, 25:1 to 100:1, 5:1 to 25:1, or less.

The photoresist 320 before contacting with the plasma effluents may be characterized by a thickness of less than or about 200 nm, such as 10 nm to 200 nm, 10 nm to 150 nm, 50 nm to 200 nm, 50 nm to 150 nm, or 100 nm to 200 nm. After operations 204 and 206, the photoresist 320 may be characterized by a thickness of less than or about 2000 nm, such as 10 nm to 2000 nm, 10 nm to 500 nm, 50 nm to 1000 nm, 500 nm to 1500 nm, or 1000 nm to 2000 nm. Comparing the photoresist 320 thickness before and after operations 204 and 206, the photoresist 320 may be characterized by a thickness change of less than or about 50 nm, such as 0 nm to 50 nm, 0 nm to 10 nm, 0 nm to 25 nm, 10 nm to 25 nm, or 0 nm to 5 nm. The thickness of the photoresist 320 after operations 204 and 206 may depend on a variety of factors include, but not limited to, the precursor gas ratios, the applied RF power(s), the chamber pressure, and the like An aspect ratio of a thickness of the photoresist 320 to the thickness of the hardmask 315 prior to etching the hardmask 315 may be characterized with an aspect ratio of less than or about 20:1, less than or about 15:1, less than or about 10:1, less than or about 9:1, less than or about 8:1, less than or about 7:1, less than or about 6:1, less than or about 5:1, less than or about 4:1, less than or about 3:1, less than or about 2:1, less than or about 1:1 or less, or 5:1 to 20:1, 5:1 to 10:1, 1:1 to 5:1, 3:1 to 5:1, or less.

An aspect ratio of a thickness of the photoresist 320 to the thickness of the hardmask 315 after etching the hardmask 315 (for example, the thickness of the hardmask 315 underneath the photoresist 320 that remains after etching the hardmask 315) may be characterized with an aspect ratio of greater than or about 20:1, greater than or about 15:1, greater than or about 10:1, greater than or about 9:1, greater than or about 8:1, greater than or about 7:1, greater than or about 6:1, greater than or about 5:1, greater than or about 4:1, greater than or about 3:1, greater than or about 2:1, greater than or about 1:1 or more, or 5:1 to 20:1, 5:1 to 10:1, 1:1 to 5:1, 3:1 to 5:1, or more. Essentially, the change in aspect ratio of a thickness of the photoresist 320 to the thickness of the hardmask 315 from prior to etching the hardmask 315 and after etching the hardmask 315 can change less than or equal to 20%, less than or equal to 15%, less than or equal to 10%, less than or equal to 9%, less than or equal to 8%, less than or equal to 7%, less than or equal to 6%, less than or equal to 5%, less than or equal to 4%, less than or equal to 3%, less than or equal to 2%, less than or equal to 1%, or less.

The method 200 may be characterized by preferential (or selective) removal of the hardmask 315 relative to the photoresist 320. Selectivity is defined as the depth 380 from the opening 370 to the bottom 365 of the feature 355 divided by the difference between a starting thickness of the photoresist 320 ($PT_S$) and a final thickness of the photoresist 320 ($PT_F$), which is shown in the below formula.

$$\text{Selectivity} = \text{Feature Depth}/(PT_S - PT_F)$$

For example, a method 200 may be performed where (i) in FIG. 3A before etching, the photoresist 320 may have a thickness of 50 nm and (ii) in FIG. 3C after etching, the photoresist 320 may have a thickness of 48 nm and the depth 380 from the opening 370 to the bottom 365 (approximately the thickness of the hardmask 315) of the features of 20 nm. In said example, the selectivity removal of the silicon-containing material 310 relative to the mask material 315 would be 20 nm/(50 nm-48 nm)=10. The method 200 may be characterized by a selectivity for removing the hardmask 315 relative to the photoresist 320 of greater than or about 4, such as greater than or about 6, greater than or about 8, greater than or about 10, greater than or about 12, greater than or about 14, greater than or about 16, greater than or about 18, greater than or about 20, greater than or about 25, greater than or about 30, greater than or about 35, greater than or about 40, or greater than or about 45, greater than or about 50, or more, or 10 to 20, 10 to 30, 10 to 40, or 15 to 30. The selectivity may depend on a variety of factors including, but not limited to, precursor gas ratios, RF power(s), chamber pressure, and the like.

During operation 202, the volumetric ratio of the hydrogen-and-fluorine-containing precursors relative to the other gases may be greater than or about 50:1. In some examples, the volumetric ratio of the hydrogen-and-fluorine-containing precursors relative to the other gases may be greater than or about 10:1 such as 10:1 to 50:1, 10:1 to 30:1, 15:1 to 40:1, or 20:1 to 50:1. In some examples, there may be substantially no other gases during the formation of the plasma effluents 350. In some examples, one or more carrier gases are present when forming the plasma effluents 350.

During any operation 202, 204, and/or 206 of method 200, a bias power may be applied to the substrate 305. The bias power may provide a directional flow of plasma effluents to the substrate 305. Thus, the etchants may be directed into the apertures 320, which may facilitate the plasma effluents to progress through the materials being etched and reach the substrate 305. In some examples, the plasma power less than or about 1,500 W, less than or about 1,250 W, less than or about 1,000 W, less than or about 900 W, less than or about 800 W, less than or about 750 W, less than or about 700 W, less than or about 600 W, less than or about 500 W, less than or about 400 W, less than or about 300 W, less than or about 250 W, less than or about 200 W, less than or about 100 W, or less, although the bias power may also be included in ranges between any two of these stated numbers or within any smaller range encompassed by any of the stated ranges. By applying a bias power, narrow ion angle distribution may result and provide better profile control (e.g., without bending and/or twisting) and verticality of the etching. The narrow ion angle distribution may reduce sidewall attack, increase the etch rate, and make the etch front more square. In some examples, the plasma power may be relatively low.

In embodiments, the bias power may be applied via an RF power supply, such as RF power supply 125, and/or a power supply used for directing DC current or voltage to the ESC, such as power supply 150. As previously discussed with regard to FIG. 1, the RF power supply and/or the power supply used for directing DC current or voltage may cycle on and off, or pulse, during processing. By pulsing, ion energy, and ion flux may be better controlled, and lower angular spread of the plasma effluents may be achieved. Additionally, the pulsing may neutralize a charge of the plasma effluents at the etch front, which may increase the uniformity of the etch. In embodiments where the bias power is applied by both the RF power supply and the power supply used for directing DC current or voltage to the ESC, the power supplies may be synchronized or non-synchronized. The DC current or voltage may be pulsed at the micro-second scale and may be characterized by duty cycle between 0% and 100%. In some embodiments, an additional electrode may be present in the ESC for the pulsed DC current or voltage, whereas other embodiments may utilize the same electrode for both chucking and pulsing. In some embodiments, RF and pulsed DC may be supplied to only the cooling base 129, while a separate DC chucking power supply 150 may be connected to the chucking electrode (mesh) within the ceramic ESC.

During any operation 202, 204, and/or 206 of method 200, a bias voltage may be applied to the substrate 305. In some examples, the bias voltage can be less than or about 3,000 V, less than or about 2,500 V, less than or about 2,000 V, less than or about 1,500 V, less than or about 1,000 V, or less, although the bias voltage may also be included in ranges between any two of these stated numbers or within any smaller range encompassed by any of the stated ranges.

During any operation 202, 204, and/or 206 of method 200, a chucking voltage of the power source may be applied to the substrate 305. In some examples, the chucking voltage can be less than or about 3,000 V, less than or about 2,500 V, less than or about 2,000 V, less than or about 1,500 V, less than or about 1,000 V, or less, although the chucking voltage may also be included in ranges between any two of these stated numbers or within any smaller range encompassed by any of the stated ranges.

Each of the operations of method 200 may be performed during a constant temperature in embodiments, while in some embodiments the temperature may be adjusted during different operations. For example, the substrate, pedestal, or chamber temperature during method 200 may be maintained at a temperature less than or about −20° C., less than or about −25° C., less than or about −30° C., less than or about −35° C., less than or about −40° C., less than or about −45° C., less than or about −50° C., less than or about −55° C., less than or about −60° C., less than or about −65° C., less than or about −70° C., less than or about −75° C., less than or about −80° C., less than or about −85° C., less than or about −90° C., less than or about −95° C., less than or about −100° C., less than or about −105° C., less than or about −110° C., less than or about −115° C., less than or about −120° C., or less, although the temperature may also be included in ranges between any two of these stated numbers or within any smaller range encompassed by any of the stated ranges.

The pressure within the processing chamber may be controlled during method 200. For example, while forming the plasma effluents and contacting materials with the plasma effluents, the pressure within the semiconductor processing chamber may be maintained below or about 50 milliTorr. Additionally, in embodiments, the pressure within the semiconductor processing chamber may be maintained below or about 45 mTorr, below or about 40 mTorr, below or about 35 mTorr, below or about 30 mTorr, below or about 25 mTorr, below or about 20 mTorr, below or about 15 mTorr, below or about 10 mTorr, or less, although the pressure may also be included in ranges between any two of these stated numbers or within any smaller range encompassed by any of the stated ranges. The pressure within the processing chamber may affect the capabilities of flow into the aperture. For example, as pressure increases, plasma effluents may have increased difficulty in permeating the aperture 320 to reach the hardmask 315. Accordingly, in some embodiments, the pressure may be maintained below or about 30 mTorr to allow effluent flow into the aperture 320 and the feature 355 being etched in the hardmask 315 on the organic material 310.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the layer” includes reference to one or more layers and equivalents thereof known to those skilled in the art, and so forth.

Also, the words “comprise(s)”, “comprising”, “contain(s) ”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing method comprising:

forming plasma effluents of a hydrogen-and-fluorine-containing precursor, wherein the hydrogen-and-fluorine-containing precursor is HE;

contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents to access the silicon-containing hardmask material, wherein the photoresist material comprises a dielectric material;

etching the photoresist material with the plasma effluents; and while etching the photoresist material, etching the silicon-containing hardmask material with the plasma effluents at a selectivity greater than or about 10 relative to the photoresist material.

2. The semiconductor processing method of claim 1, wherein a volumetric ratio of the hydrogen-and-fluorine-containing precursor relative to other gases is greater than or about 50:1 when forming the plasma effluents.

3. The semiconductor processing method of claim 1, wherein a carrier gas is present when forming plasma effluents.

4. The semiconductor processing method of claim 1, wherein a temperature in the processing region is maintained at about −20° C. or less.

5. The semiconductor processing method of claim 1, wherein silicon-containing hardmask material comprises one or more of: a silicon-containing anti-reflective coating, and SiON.

6. The semiconductor processing method of claim 1, wherein one or more apertures are characterized by a critical dimension of less than or about 50 nm.

7. The semiconductor processing method of claim 1, wherein prior to etching the silicon-containing hardmask material, an aspect ratio of a thickness of the photoresist material to a thickness of the silicon-containing hardmask material is less than or about 20:1 and greater than 4:1.

8. The semiconductor processing method of claim 1, wherein after etching the silicon-containing hardmask material, an aspect ratio of a thickness of the photoresist material to a thickness of the silicon-containing hardmask material is greater than or about 4:1.

9. The semiconductor processing method of claim 1, wherein a thickness of the photoresist material is about or less than 50 nm.

10. The semiconductor processing method of claim 1, wherein a pressure in the processing region is maintained at about 50 milliTorr or less.

11. The semiconductor processing method of claim 1, wherein the plasma effluents are generated at a plasma power of about 1000 W or less.

12. The semiconductor processing method of claim 1, wherein a chucking voltage of a power source of the semiconductor processing chamber is about 2000 volts or less.

13. The semiconductor processing method of claim 1, wherein the photoresist material is configured for EUV patterning.

14. The semiconductor processing method of claim 1, wherein after the etching of the silicon-containing hardmask material, the organic material is exposed.

15. A semiconductor processing method comprising:

forming plasma effluents of a hydrogen-and-fluorine-containing precursor, wherein a volumetric ratio of the hydrogen-and-fluorine-containing precursor relative to other gases is greater than or about 50:1 when forming the plasma effluents;

contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents to access the silicon-containing hardmask material, wherein the photoresist material comprises a dielectric material;

etching the photoresist material with the plasma effluents; and while etching the photoresist material, etching the silicon-containing hardmask material with the plasma effluents at a selectivity greater than or about 10 relative to the photoresist material.

16. The semiconductor processing method of claim 15, wherein prior to etching the silicon-containing hardmask material, an aspect ratio of a thickness of the photoresist material to a thickness of the silicon-containing hardmask material is less than or about 20:1 and greater than 4:1.

17. A semiconductor processing method comprising:

forming plasma effluents of HF gas, wherein a carrier gas is present;

contacting a silicon-containing hardmask material and a photoresist material with the plasma effluents in a processing region of a semiconductor processing chamber, wherein a substrate is disposed on a substrate support within the processing region, wherein an organic material is disposed on the substrate, wherein the silicon-containing hardmask material is disposed on the organic material, and the photoresist material is disposed on the silicon-containing hardmask material, wherein the photoresist material has one or more apertures therein that allow the plasma effluents to access the silicon-containing hardmask material, wherein one or more apertures are characterized by a critical dimension of less than or about 50 nm, wherein the photoresist material is configured for EUV patterning;

etching the photoresist material with the plasma effluents; and while etching the photoresist material, etching the silicon-containing hardmask material with the plasma effluents at a selectivity greater than or about 10 relative to the photoresist material.

18. The semiconductor processing method of claim 17, wherein prior to etching the silicon-containing hardmask material, an aspect ratio of a thickness of the photoresist material to a thickness of the silicon-containing hardmask material is less than or about 20:1 and greater than 4:1.

19. The semiconductor processing method of claim 17, wherein silicon-containing hardmask material comprises one or more of: a silicon-containing anti-reflective coating, and SiON.

* * * * *